United States Patent
Bennett

(10) Patent No.: US 9,838,045 B1
(45) Date of Patent: Dec. 5, 2017

(54) APPARATUS AND METHOD FOR ACCESSING COMPRESSED DATA

(71) Applicant: VIOLIN MEMORY INC., Santa Clara, CA (US)

(72) Inventor: Jon C. R. Bennett, Sudbury, MA (US)

(73) Assignee: VIOLIN SYSTEMS LLC, San Jose, CA (US)

( * ) Notice: Subject to any disclaimer, the term of this patent is extended or adjusted under 35 U.S.C. 154(b) by 0 days.

(21) Appl. No.: 15/059,874

(22) Filed: Mar. 3, 2016

Related U.S. Application Data

(60) Provisional application No. 62/128,721, filed on Mar. 5, 2015.

(51) Int. Cl.
*G06F 11/10* (2006.01)
*H03M 13/00* (2006.01)
*G06F 3/06* (2006.01)

(52) U.S. Cl.
CPC ........ *H03M 13/6312* (2013.01); *G06F 3/064* (2013.01); *G06F 3/0619* (2013.01); *G06F 3/0673* (2013.01); *G06F 11/1076* (2013.01)

(58) Field of Classification Search
USPC ........................................ 714/764, 770, 773
See application file for complete search history.

(56) References Cited

U.S. PATENT DOCUMENTS

| | | | |
|---|---|---|---|
| 7,898,882 B2* | 3/2011 | Darbinyan | G11C 29/802 365/185.09 |
| 7,961,959 B2* | 6/2011 | Bashyam | G06T 9/002 382/224 |
| 2008/0050027 A1* | 2/2008 | Bashyam | H04N 19/13 382/238 |

* cited by examiner

*Primary Examiner* — Fritz Alphonse
(74) *Attorney, Agent, or Firm* — Brinks Gilson & Lione

(57) ABSTRACT

A system and method for storing compressed data in a memory system includes identifying user data to be compressed and compressing pages of user data to form data extents that are less than or equal to the uncompressed data. A plurality of compressed pages are combined to a least fill a page of the memory. The data may be stored as sectors of a page, where each sector includes a CRC or error correcting code for the compressed data of that sector. The stored data may also include error correcting code data for the uncompressed page and error correcting code for the compressed page. When data is read in response to a user request, the sector data is validated using the CRC prior to selecting the data from the read sectors for decompression, and the error correcting code for the uncompressed page may be used to validate the decompressed data.

15 Claims, 9 Drawing Sheets

APPARATUS AND METHOD FOR ACCESSING COMPRESSED DATA

The present application claims the benefit of U.S. provisional application Ser. No. 62/128,721, filed on Mar. 5, 2015.

TECHNICAL FIELD

The subject matter of the present application may relate to the storage and management of data in a memory system.

BACKGROUND

Deduplication reduces the memory space required to store digital information where more than one user or application references data that is the same data. For example, a same attachment may be found in an email sent to a plurality of recipients and each one of the recipient's email and attachment may be stored in a storage system. The attachment may be forwarded to another recipient or recipients and the attachment stored again. Where the data is stored in a common memory system, the aim of deduplication is to store the data only once, and to provide access to the data through a mapping using metadata. For certain types of data this is very effective in reducing the storage requirements.

The size of a deduplicated memory area is reduced by eliminating unnecessary copies of the data. There is some additional memory required to store the metadata to keep track of the stored single copy of the deduplicated data, and additional processing time to perform the deduplication process and to retrieve deduplicated data, but the overall effect, in practice, is to substantially reduce the required memory space.

Many types of data also exhibit internal redundancy within a page or file. That is, the data may have patterns of repetitions which may be represented in a more compact form. The lower the Shannon Entropy of the data of an extent of data, the less information that is represented by the extent of data and the number of bytes that may be needed to represent an extent of data may be reduced. This process is termed data compression. Depending on the type of data to be stored, the compression may be performed in a lossless or lossy manner. Lossless compression is a reversible process where the data may be exactly recovered by decompression. Lossy compression results in some loss of data fidelity, but may be acceptable for images, sound, and the like where reproduction limitations may limit the fidelity of the data without impacting the user.

Where the term compression is used, either type of compression may be meant, where the specific compression algorithm is selected based on the type and use of the data, although data compressed by lossy compression techniques cannot be restored to exactly the original form. Compressing a page of data, for example, results in the data of an original page being represented by less than the number of bytes needed to store the original data page in an uncompressed form.

Storage media such as rotating disks, FLASH memory circuits or the like are ordinarily based on some standardized media format or access protocol. This has led to the formatting of data in accordance with constructs such as sector, page, block or the like, each one having a fixed size, at least in a particular example. In such an example, typical rotating disks are formatted into sectors (512 bytes) and pages comprising multiple sectors. For example a 4 KB page would have 8 sectors. This terminology has evolved historically and one may find sectors that are multiples of 512 bytes and pages that are multiples or sub-multiples of 4K, this is the nominal size although typically there is a additional spare area that may be used for metadata such as an error correcting code (ECC) and other descriptive information. This area may, however, be used for data and in the same manner the data area could be used for metadata.

SUMMARY

A method of storing and retrieving data in a storage system is disclosed, where the data may be optionally compressed prior to storage in the storage memory. The memory is comprised of storage pages of a first length and the storage pages are comprised of an integral number of sectors of a second length. A page of data that is to be stored as compressed data is compressed by a data compression engine, which may be part of a processor system, to a length that is less than the length of a page of the storage page. Additional data pages are compressed and the compressed data pages are concatenated until the total length of the concatenated pages, including any metadata, exceeds that of the storage page. Space is provided in each sector to store a cyclic redundancy code (CRC) or a first error correcting code (ECC) that is computed for the compressed data that is in the sector.

Where the total length of the concatenated data exceeds that of a page, the excess data may be stored as part of concatenated data on another page. Thus the first ECC or CRC is associated with the data to be stored in a sector, which may be, for example, only a part of the compressed data associated with a page of uncompressed user data. Prior to compression of the data, a second ECC may be computed over the page of uncompressed user data, which may include metadata. The second ECC may be stored in an uncompressed form or compressed with the associated data. Prior to storage of the page of compressed concatenated data, a third ECC may be computed over the physical page of concatenated data, which may represent a plurality of compressed pages or portions thereof. Since, in a particular example, the length of first and third ECC is known and the length of the second ECC may be known, storage space may be reserved for insertion of the ECC data while conforming to the sector and page lengths of the storage system.

The CRC is intended to protect data in transit from the processor to the storage medium and the association of the CRC with fixed length sectors facilitates the identification of the CRC in a field of data that may have no identifiable structure. The second ECC may be applied to the data before or after it has been decompressed, depending on the embodiment so as to validate the data and protect against errors not identified by the CRC. The CRC may be used to initiate resends or rereads of the data prior to decompression, but the strength of the CRC itself cannot be depended upon for data integrity. The processing associated with the CRC may require considerably less resources than the second ECC.

The ECC used may include BCH codes, low density parity codes (LDPC) or other such codes as are known in the art or may be developed for the purpose of protecting and correcting the stored data. In addition to the ECC associated with the data, the data may be stored in a redundant manner using the concept, for example, of redundant array of independent disks (RAID) as is now applied to FLASH memory systems.

A method of reading concatenated compressed data includes using the metadata of the storage system to identify the location of data requested by a user to a granularity of less than a storage page. While data read from a page of FLASH memory is read into a local buffer, the efficiency of use of a communications bus is improved if only the sectors having data corresponding to the desired uncompressed data are transmitted over the bus. Since each compressed data page may have a length different than that of a sector, some unrelated data may be read. After validation of the CRC for the sectors that have been read, the unrelated data may be discarded.

Where the CRC indicates an error, a re-read may be initiated. The data that has been read, after discarding of the unrelated data, is decompressed and, for example, the validity of the data is verified by the second ECC which is associated with the original uncompressed data page. Where an error persists, and where the third ECC for the stored page is provided, error recovery may include reading the entire stored page, recovering the error and then discarding the unrelated data.

In another aspect, a computer program product, stored on a non-volatile computer readable medium may have instructions to cause a processor, computer or the like, to perform the steps of the methods described above.

DESCRIPTION

Figure 1:
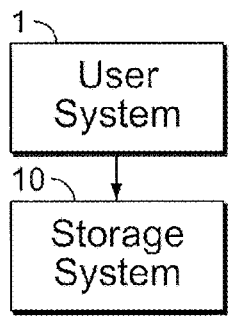
FIG. 1 is a block diagram of the relationship of a user system to a storage system.

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated that the methods described and the apparatus shown in the figures may be configured or embodied in machine-executable instructions, or electronic components: e.g. software, or in hardware, or in a combination of both. The machine-executable instructions can be used to cause a general-purpose computer, a special-purpose processor, such as a DSP, array processor, or the like, that acts on the instructions to perform functions and actions described herein.

Alternatively, the operations might be performed by specific hardware components that may have hardwired logic or firmware instructions for performing the operations described, or by any combination of programmed computer components and custom hardware components, which may include analog circuits. Such components may include Application Specific Integrated Circuits (ASIC), Field Programmable Gate Arrays (FPGA), or the like which may exist or are being developed and have the capability of configured or configurable logic.

The methods may be provided, at least in part, as a computer program product that may include a non-volatile (non-transitory) machine-readable medium having stored thereon instructions which may be used to program a computer (or other electronic devices) to perform the methods. For the purposes of this specification, the terms "machine-readable non-transitory medium" shall be taken to include any medium that is capable of storing or encoding a sequence of instructions or data for later execution by a computing machine or special-purpose hardware and that may cause the machine or special purpose hardware to be operable to perform any one of the methods actions or functions of the present disclosure. The term "machine-readable medium" shall accordingly be taken include, but not be limited to, solid-state memories, optical and magnetic disks, magnetic memories, and optical memories, as well as any equivalent device that may be developed for such purpose.

For example, but not by way of limitation, a machine readable medium may include read-only memory (ROM); random access memory (RAM) of all types (e.g., S-RAM, D-RAM, P-RAM); programmable read only memory (PROM); electronically alterable read only memory (EPROM); magnetic random access memory; magnetic disk storage media; FLASH memory, which may be NAND or NOR configured; memory resistors; or electrical, optical, acoustical data storage medium, or the like. A volatile memory device such as DRAM may be used to store the computer program product provided that the volatile memory device is part of a system having a power supply, and the power supply or a battery provides power to the circuit for the time period during which the computer program product is stored on the volatile memory device.

For purposes of claim interpretation, the memory for storing a computer program product is "non-transitory," where such a definition is given the broadest interpretation in terms of applicable memory types and techniques consistent with governing case law. Functions that are performed by a computer operable to process and execute the code may be equivalently performed by an electronic circuit.

Furthermore, it is common in the art to speak of software, in one form or another (e.g., program, procedure, process, application, module, algorithm or logic), as taking an action or causing a result. Such expressions are merely a convenient way of saying that execution of the instructions of the software by a computer or equivalent device causes the processor of the computer or the equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

When a 4 KB user page of data has been compressed, it is represented by less than 4 KB of data that needs to be stored. That is, a 4 KB user page may be compressed, in an example, by a factor of 2, resulting in a need to store 2 KB of data. If the memory system storing the data is configured so as to accept data in pages of 4 KB, the storage of compressed user data will be inefficient: the storage page will not be filled by the compressed data which originally had a size equal to the 4 KB page size. Moreover, the size of the compressed user data will depend on the efficiency of the compression algorithm and on the compressibility of the data itself. In order to mitigate the packing problem of compressed data, the data to be stored may need to be fragmented and assembled so that data representing more than a single 4 KB user data page can be stored in a 4 KB block of memory storage area, where a block may be a page of physical memory. Depending on the compression achieved, the data for a compressed user page may share the storage page with some or all of the compressed data for another user data page.

Where the term "user" is employed, it is intended to be interpreted in a broad sense where any higher level process, such as a virtual machine, or allocated logical unit number (LUN), or a file comprised of records, or the like, is a "user" of this aspect of the storage system. Moreover, the data of individual "users" may be stored separately or comingled in accordance with a policy.

Apart from the computation resources and metadata needed to keep track of this scattering of the compressed user data, the retrieval of user data in response to a user read request may be inefficient in the context of the underlying electronic storage equipment architecture. The most efficient packing of data to be stored would have the end of one page of compressed user data be one byte lower in address location than the beginning of the next page of compressed user data to be stored. This may be termed concatenated. However, a sector that is not completely filled with data or metadata may be padded with dummy data so as to from a compete sector for concatenation.

Data integrity is a significant consideration in the design of data storage systems. Loss of stored data or corruption of stored data is considered a serious failure, particularly in enterprise applications. The level of data protection that is designed into a storage system is usually commensurate with the intended application.

Error correction codes (ECC) and related erasure codes, such as RAID, and the like, may be used by the storage system to avoid corruption or loss of the stored data. Data may protected from end-to-end of the system, including the storage of the data and the routing of data along the communications paths of the storage system, and external to the system as well, so as to ensure data integrity. Often the data protection during data transmission is facilitated by the use of a cyclic redundancy code (CRC) that is periodically inserted in the data stream.

In practice, some of these error correction techniques may be most efficiently performed on fixed data lengths, either for theoretical reasons associated with the particular algorithm used, for computation efficiency or the like. In an aspect, when the data has been compressed, the boundary between successive compressed data segments may not be commensurate with the boundaries established for access to stored data or the protection of the data by the media upon which the data is stored or transmitted. However the segments may be concatenated and the error detection and error correcting codes may be applied to sectors or pages corresponding the physical size of the memory region in which the data is stored.

In the context of a present day FLASH memory device, for example, a minimum access size may be a 512 byte sector, or a 4 KB page comprised of 8 sectors, and an extent may be a FLASH block of, for example 256 pages, a FLASH memory plane of 4K blocks or a FLASH device of 8K blocks. These values are representative of relative relationships, but a person of skill in the art will recognize that other values are used, dependent on the specific device manufacturer and operating mode, and that these terms may therefore encompass a variety of values without departing from the concepts described herein. While NAND FLASH memories have particular restrictions on the process of writing data to memory, such as writing data to integral pages of a block in sequential order and erasing the entire block before writing data again to a page of the block, these restrictions are not applicable to other memory types, and there is no intention to limit the applicability of the system and method described herein to NAND FLASH memory circuits.

The data received from a user may be, for example, in a file having a known length, where each specific received file has a different length, which may be of the order of megabytes (MB) or gigabytes (GB), where each file has a length depending on the specific content thereof, or in the form of a page of data, where each of the pages is of a known size such as 4 KB. Each user and application may supply a different format of data, yet by the stage of the process where the data is to be stored on the non-volatile storage media, this data may be described in terms that are compatible with the storage medium and technique rather than the format understood by the user. Where the storage medium has an access size of a block, or chunks within a block, the location of data in the storage medium for purposes of storing, retrieving and data integrity may map to the storage medium characteristics. Chunks may be sectors and blocks may be pages, for example. There is inevitable confusion in terminology in this field between logical and physical data representations, but a person of skill in the art will be able to discern the difference.

An initial example illustrates storage of the data in the memory system where the data not striped or RAIDed for redundancy, as that operation can be understood as being overlaid on the lower-level operations described in the example. Then, a RAIDed example is described.

Figure 2:
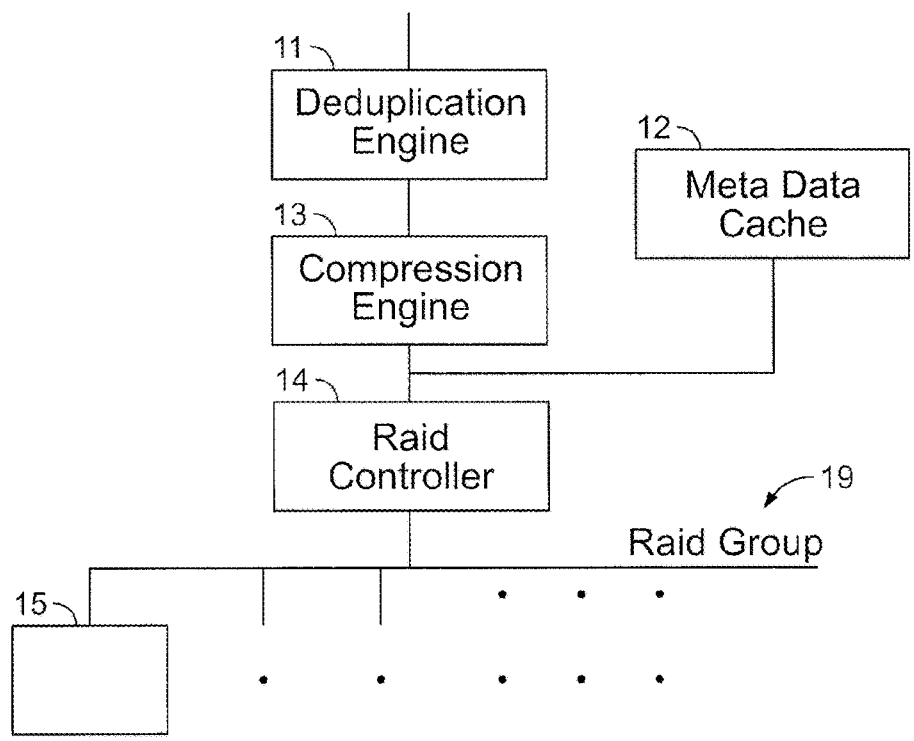
FIG. 2 is a block diagram of an example of a data storage system the performs deduplication of data and compression of date prior to storing the data in a RAIDed memory system.

A data storage system 10 may be in communication with a user system 1 over a network or communications channel as shown in FIG. 1. An example of a storage system 10 is shown in FIG. 2 where the storage system 10 may be comprised of a deduplication engine 11, a compression engine 13, a RAID controller 14 and a metadata cache device 12, which may be NVRAM, RAM or the like, for storing all or part of the metadata. The storage device 12 may also serve as a cache device for frequently accessed user data. Each of the deduplication engine 11, the compression engine 13 and the RAID controller 14 may be comprised of a processor, memory, interfaces or the like and may be separate devices in a chassis or a plurality of chassis. The functions of the engines may be combined or separately embodied, and the metadata cache 12 may be associated with one or more of the other storage system elements.

Compression and deduplication are separate operations and may be performed in any order, or not performed at all, depending on the circumstances.

Figure 3:
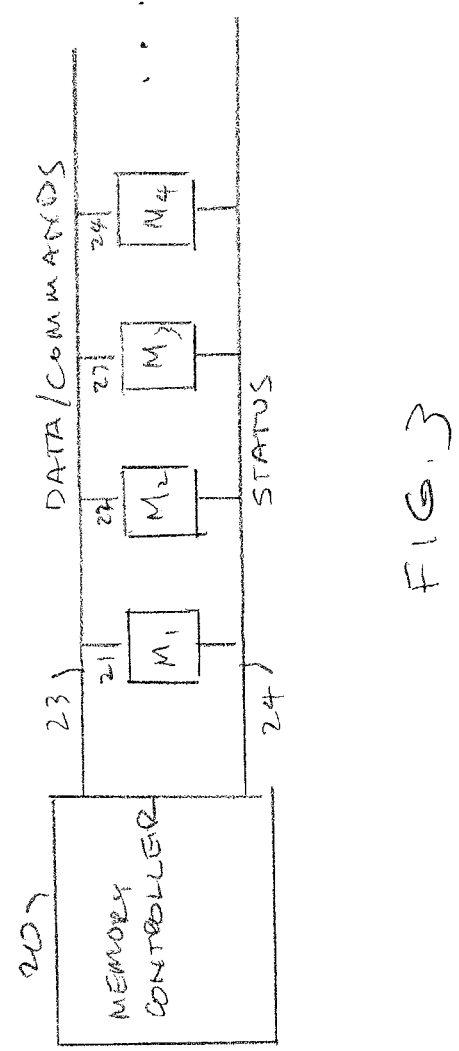
FIG. 3 is an example of a memory module in the memory system.

The RAID memory group 19 may be comprised of memory modules 15 that may be a subset of a plurality of memory modules forming a non-volatile storage portion of the memory system 10. Each of the memory modules may comprise, for example, a memory controller 20 communicating with a plurality of FLASH memory circuits 21 over a bi-directional multiplexed bus 23 for commands and data, and the status of the memory circuits may be polled over another bus 24 as shown in FIG. 3. Other arrangements may be used, for example, which result in each of the FLASH memory circuits having a separate interface to the memory controller 20.

Figure 4:
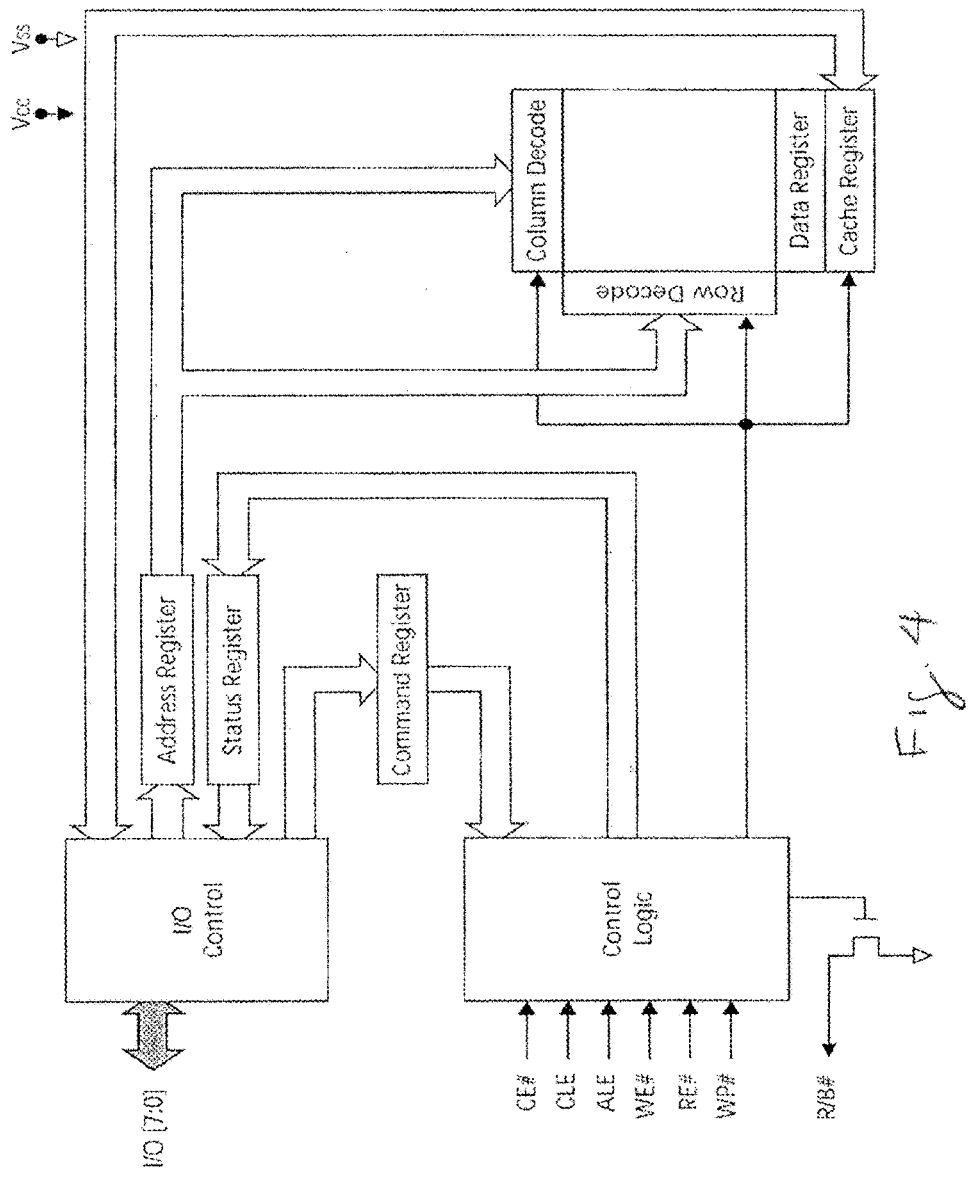
FIG. 4 is a block diagram of an individual memory circuit in the memory system.

The FLASH memory circuit of FIG. 4 represents a device that has an internal bus that is multiplexed so as to address a plurality of planes of the memory circuit. Where the capacity of the FLASH memory circuits embodied in a package is increased, for example, the emphasis may be on adding memory capacity, or increasing lifetime by using a larger feature size in the fabrication of the device, and the additional plane, chips or the like may communicate with the memory controller 20 over an internal multiplexed bus, which is typically a byte parallel configuration.

Figure 5:
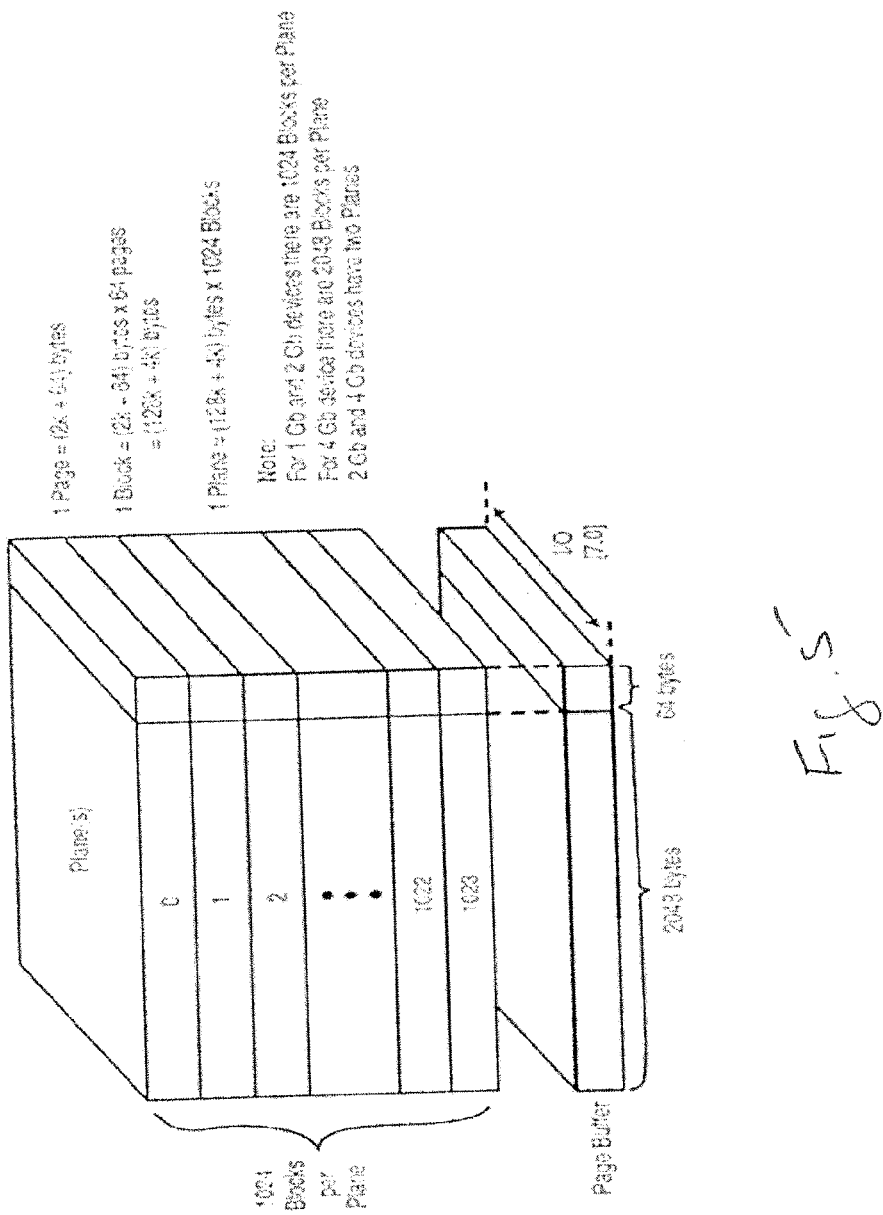
FIG. 5 illustrates the concept of a plurality of blocks of pages forming the storage of a memory chip, and the relationship of the size of a block to a page buffer.

FIG. 5 illustrates a concept of data storage in a typical FLASH device, where the data is stored in a 4 KB page, representing an access block and a spare area of each page may be, for example 64 bytes. The data (including the spare area) may be read and read by transferring the stored data into a local register 25 (FIG. 4); the data in local register 25 is transferred to a local buffer 26 so as to be clocked out along the bus 23 in byte-parallel format. Reading the data from the FLASH memory is very rapid, taking perhaps 25 usec to read a 4 KB region of FLASH memory aligned with integral 4 KB memory increments into the register 25 in accordance with the storage address supplied by the memory controller 20. All, or a portion of, the data in the volatile memory register 25 that has been transferred to the local buffer 26 may clocked out of the device onto the multiplexed bus so as to be sent to the memory device interface to the controller 20. The memory controller 20 may determine the status of read requests or write operations at each of the FLASH memory circuits Mn by polling the circuits using a common sensing line 24 or individual sensing lines, depending on the specific embodiment.

Presently available FLASH memory devices may typically transfer data at about 166 MT/sec as an example. This is not intended to be a limitation on the concepts presented herein, but to assist in understanding the problems of efficiently using a large amount of memory and a shared bus.

The performance of the internal bus 23 of the memory device places a limit on the speed of data transfer, and moving unnecessary data over the bus limits the performance of the memory device. This is evident, as the time to perform a read operation may be about 25 usec+0.03 usec/byte (150 μsec for a 4 KB data page), which is substantially greater than the time to access the data (about 25 μsec) and place the data in the local buffer 26. One can perhaps expect improvements in bus speed and architecture in the future, but transferring unnecessary data over the bus is always inefficient.

The amount of memory space need to store a page of user data may be reduced by compressing the user data. Selection of a compression algorithm may be as a generic algorithm for all data types, an algorithm selected by comparison of the results of a number of algorithms applied to the same data, by determining the Shannon Entropy, or the like. Whatever algorithm is used may be identified by some indicia in the metadata stored with or associated with the compressed data so that the data may decompressed when read. The data compression ratio will vary depending on the compression algorithm and characteristics the data, so the compressed data in each instance is some fraction of the size of the uncompressed data. For some types of data (e.g., tables of a data base with all zeros but having a serial number) the compressed data may be a very small fraction of the original data and may be sufficiently small so as to be stored as metadata. For other types of data, such as user encrypted data, the compressed data size may be comparable to the original data and, when including the metadata, the compression may not be very effective.

Some or all of the stored data may be encrypted after compression so as to provide protection for the data at rest. Encryption at rest for protection of stored data may be done after the compression process has been performed and differs in function from storage of data received by the system from the user in user- or transport-system encrypted form.

If the original user-supplied data has a size of 4 KB, the compressed data may have a size ranging from less than 512 B to almost 4 KB. Storing the compressed data at 4 KB increments of physical address does not increase the storage capacity as the 4 KB increments would no longer be completely filled by the stored data and metadata. Packing a number of compressed data instances into a 4 KB page of physical memory would reduce the amount of space needed to store the data. Each of the compressed data instances has associated metadata and the data and metadata being communicated over the bus needs to be protected by, for example, a CRC that may be stored with the data. Moreover, the size of each compressed data instance depends on the characteristics of the user data page and the specific compression algorithm used.

Present FLASH memory devices provide for the description of a storage location as, for example, being a 4 KB page with eight 512 B sectors. So, when a plurality of compressed data extents are amalgamated into a block for storage, each of the 512 B sector data may be protected by a CRC, and the 4 KB block itself may be protected by an ECC and perhaps a second CRC. The ECC may be used at a page level for efficiency as the number of bits in the ECC can be more efficiently used on large block sizes. However, if the data is to be read with a granularity smaller than a page, an ECC may be applied to each of the data extents being compacted into the physical page. As the techniques for compressing and concatenating data may result in a significant saving in memory needed to store the user data, the specific ECC types selected may be chosen with greater freedom to use a higher level of protection or a combination of ECC types which would be considered impractical for uncompressed data.

When a 4 KB page of user-furnished data is compressed, the amount of data needed to represent the user data has been reduced. The reduction may be by more than a factor of 10 for some data types and formats. More efficient use of the non-volatile FLASH memory space may be obtained by packing the data such that at least substantially all of the memory locations of the physical memory page or access block are used for data or data protection.

Figure 6:
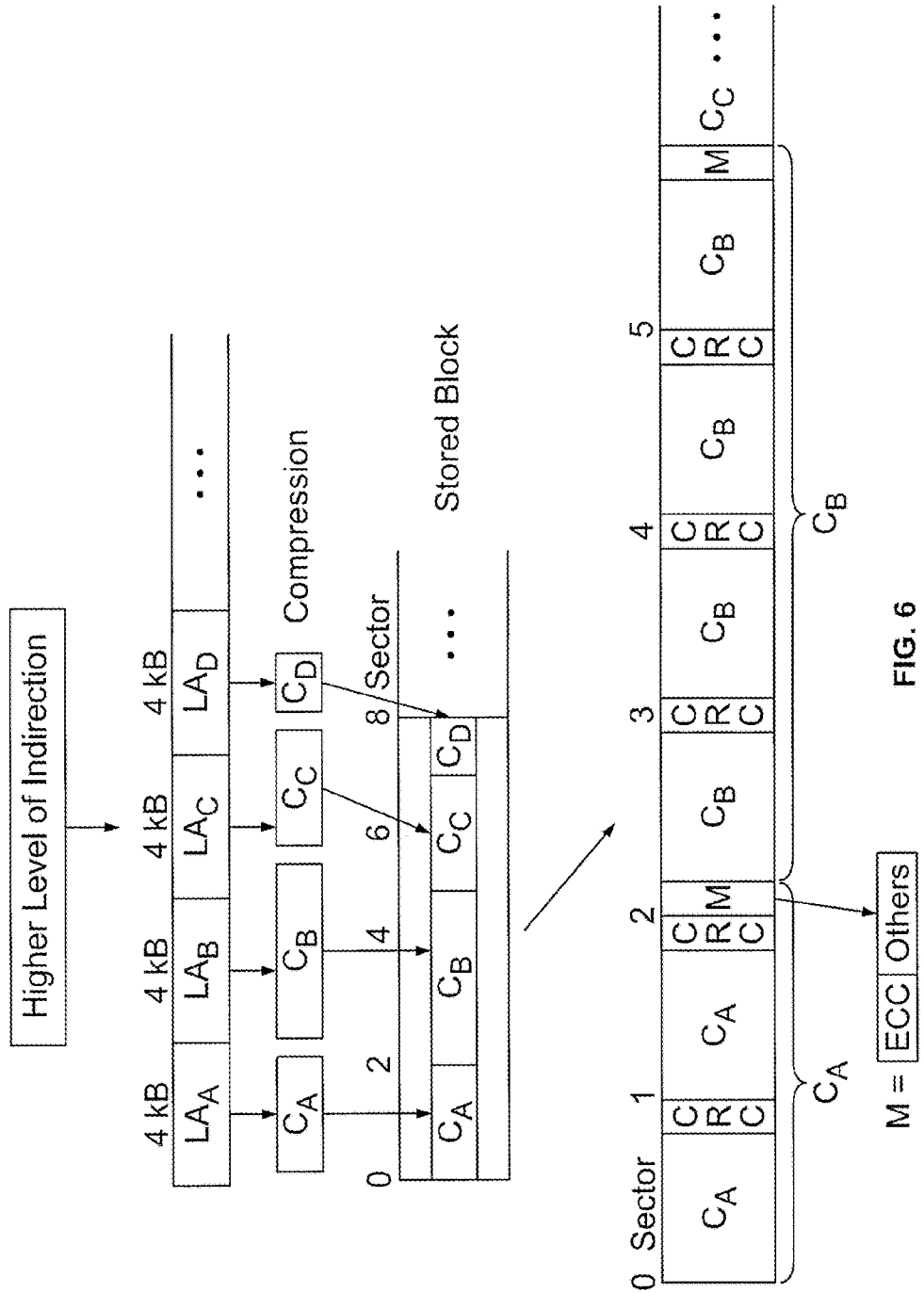
FIG. 6 is an example of data structures that may be used in the process of storing concatenated compressed data in the memory system.

From the viewpoint of the data itself, the process may be visualized in FIG. 6. The user data LAn is received and compressed to form instances Cn of compressed data having a smaller size than the original data. Depending on the size of each of the instances a plurality of instances Cn may be assembled so as to form a packed data extent which, including the metadata, which includes the CRC and other housekeeping data, fills a data access block, which may be 4 KB for an example of FLASH memory. Where the sectors are 512 bytes in size, the boundary between successive compressed data instances may not coincide with a sector boundary. In effect a substantially continuous extent comprising a plurality of compressed data extents and associated metadata is overlaid on the regular characteristics of the storage system. If the CRC is associated with a sector, the CRC data occurs at regular intervals corresponding to the sector boundaries, but other aspects of the data may not occur at regular intervals.

In the example of FIG. 6, the first compressed data page $C_A$ is seen to fill sectors 0 and 1, and the second compressed data page $C_B$ fills sectors 2, 3, 4 and part of sector 5. Since a page of physical storage in the example comprises 4 sectors, this means that $C_A$ is stored in a first page, and a part of $C_B$ fills a part of a second page. So the total memory requirements for storing two pages of user data is less than the total size of the user data. Additional user data, e.g., Cc, and potentially other data may be stored in the second page. When considering physical pages, the pages may be sequential in a block of pages, but the pages may be in different block or different memory circuits and tracked with metadata.

Figure 7:
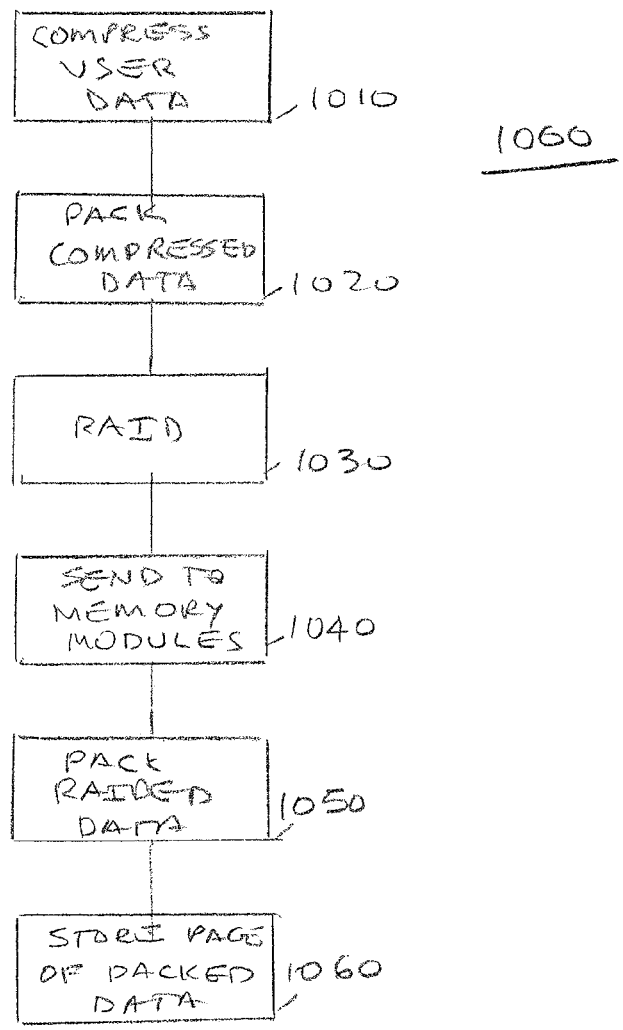
FIG. 7 is a block diagram of the process of storing concatenated compressed data in the memory system.

FIG. 7 illustrates the steps in a method 1000 of preparing data for storage in a physical storage page of storage system 10. The original data of 4 KB size is compressed (1010), yielding a plurality of smaller sized compressed data extents of varying size. A sector of a page is filled with data from one or more compressed data extents and may include a CRC for each 512 B sector. The CRC may be a 32-bit CRC, for example and stored as 5 bytes. The CRC may be inserted into the data stream by the communications interface after step 1020 where the data itself has been packed into a page. As the CRC is checked as part of the communications path integrity, the CRC would be more efficiently computed on the data to be stored, which may be at least one of compressed or encrypted. If the CRC is inserted at a periodic interval in the data, for example 512 bytes, the CRC can be identified by its periodicity even if the data is encrypted.

In an example each 512 B sector includes a CRC or the like, and each compressed data extent includes an ECC, so that both the compressed data and the transmission of the data are protected. An ECC may also be that of the data prior to or after the compression step, and the validation of the data that has been read is then performed before or after decompression as the case may be. In an alternative, an ECC may be computed on the compressed and encrypted data comprising a representation of a stored physical data page.

Having assembled a 4 KB extent of data comprising a plurality of compressed data extents, each of which may represent a 4 KB page of user data, the plurality of compressed data segments may be stored with a page write operation. Since the sizes of the compressed data extents are variable, the page may not contain an integral number of compressed data extents. A portion of a compressed data extent may be contained in another page, which may be an adjacent page or a non-adjacent block. Such a block need not be located in the same memory circuit or memory module.

In an aspect, the 4 KB data page comprised of a plurality of compressed data extents may be processed by a RAID controller (1030) such that a portion of each block is dispatched to each of the memory modules of a RAID group (1040). In an example where the block is 4 KB and the RAID configuration is 4+1, a 1 KB parity segment is computed from 4 1 KB segments of the data to be stored and each segment is then sent to a separate memory module to provide for redundant storage. At the each memory module 20, three additional 1 KB segments, representing the data for three more RAIDed pages which may be unrelated to the first 1 KB segment are combined into a 4 KB page at the memory module (1050) which may then be efficiently stored in the FLASH memory circuit. Alternatively, the combining step 1050 may be performed at the RAID controller.

Figure 8:
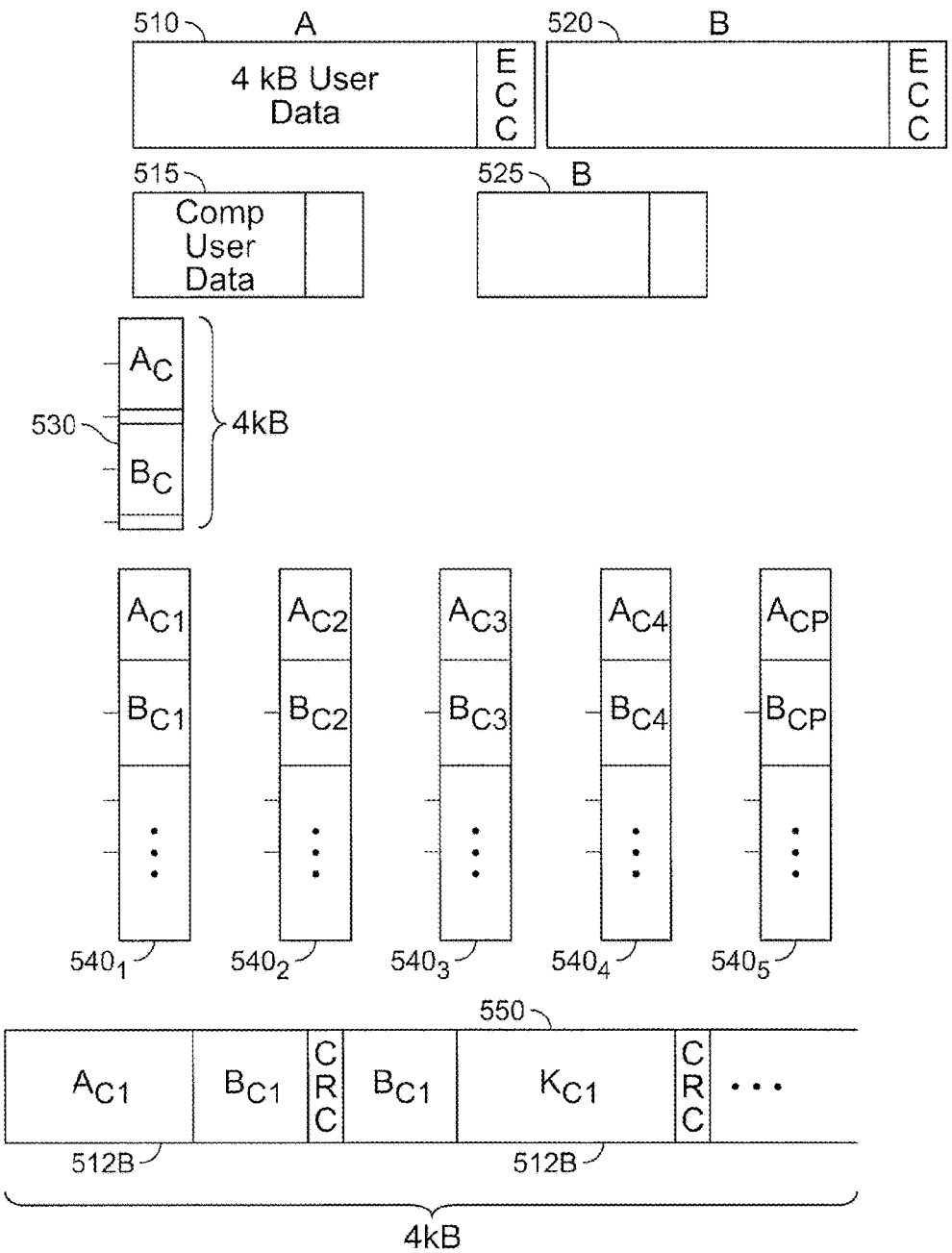
FIG. 8 shows data structures associated with storing concatenated compressed data in using a RAID format.

This process may also be visualized from the perspective of the data (FIG. 8), where two user blocks 510 and 520, each having an associated ECC, are compressed to form compressed data extents 515 and 525. For ease of exposition, it is assumed that the two data blocks fortuitously have a combined size of 4 KB including all of the associated metadata and may be packed into a 4 KB access block 530. This data access block, comprised of two compressed user pages 510 and 520 may be distributed over a RAID group 540 such that each of the memory modules of the RAID group is allocated either a 1 KB segment of the compressed data or the parity associated with the 1 KB segment.

At this juncture only 1 KB of the page size of the FLASH memory has been allocated at each memory module. Depending on the specific FLASH memory circuit, this may be written as a two sectors of data, or three more 1 KB segments received from the RAID controller and the data written as a page.

The data as stored in the FLASH memory circuit has had a CRC inserted every 512 bytes, and the ECC data may be internal to the compressed data.

Figure 9:
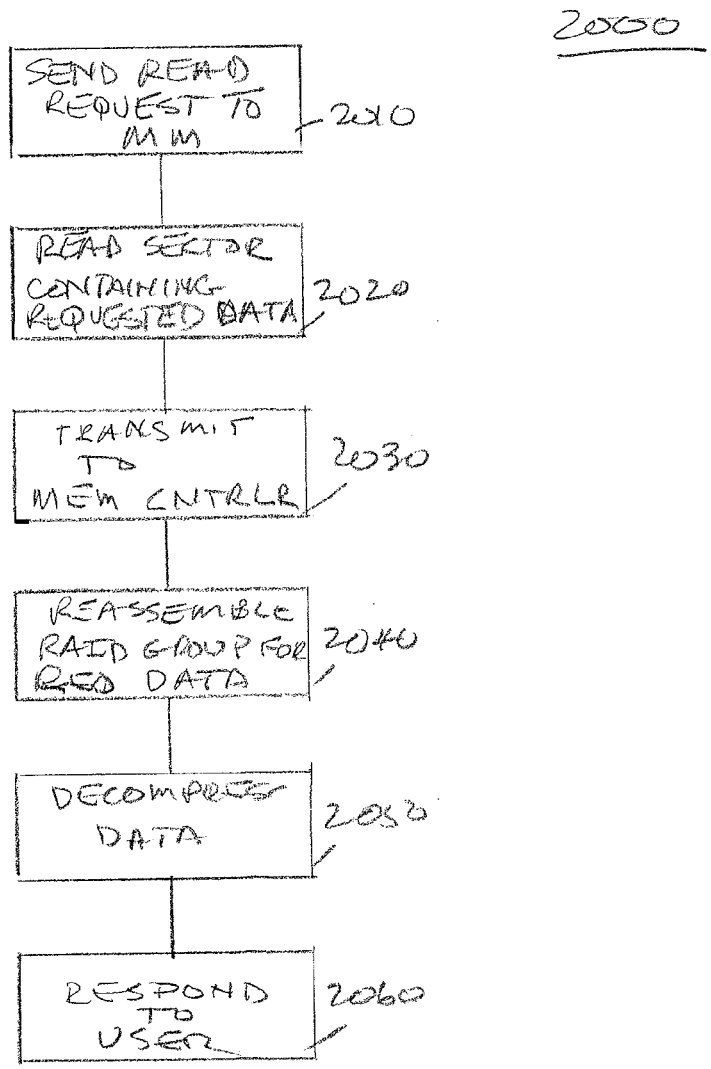
FIG. 9 shows the process of reassembling the concatenated compressed data from a RAID group.

When the user retrieves this stored data (2000) from the storage medium by a method shown in FIG. 9, after traversing the various levels of abstraction and indirection the storage-system logical address of compressed version of the uncompressed 4 KB user data is ascertained. For identification purposes, this may be called the LA as described above, which may be mapped to the physical address (PA) in the FLASH memory circuit of the memory module, taking account of the various actions performed by the storage method 1010.

While the LA has a starting address that is modulo 4 KB, the PA of the compressed data may not. The PA has a starting address that may be, for example, a PA block base address with an increment size of a physical 4 KB page and a data start address within the block, for example, a byte (or a multiple of a byte) within the physical page. The length of the data segment may be different for each of the extents of compressed data. The extent of compressed data may lie within a 512 B sector increment or bridge one or more sector boundaries. In general, the extent may be beyond the limit of the physical page and the remainder of the data retrieved from another physical page, which may be non-sequential. Other addressing schemes would be apparent to a person of skill in the art. While the starting address of the desired PA may be known to a resolution of one byte, for example, the data to be retrieved may be identified in terms of one or more 512 B sectors containing the data so that that the CRC may be used to protect the data in transmission.

The resultant PA address (block or page number, offset and length) is used to generate a read request to the memory circuit 20. The block number identifies the page region of the memory circuit containing the data, and the offset and length position the location of the compressed data to be retrieved within the block to a granularity of a sector (in this example 512 B).

Where the entire extent of the compressed data (which includes the metadata) falls within an integral 512 B sector, the data of the single 4 KB block is read into the volatile data register and only the selected 512 B sector is transmitted over the bus 23. This provides an improvement of a factor of 8 in bus capacity as compared with a situation where the entire block of 4 KB is transmitted over the bus and the unwanted data discarded at a later point in the processing. Multiple sectors of the block may be read once in the volatile data register.

Where the extent of the compressed data that is read extends over a plurality of contiguous sectors, all of the sectors having the desired data are read out to the memory controller 20. The improvement in bus efficiency then depends on the amount of compression that had initially been achieved.

The data that is returned to the memory controller 20 comprises the compressed data that is desired (2030), an may include some data that is not desired, but which fell within the beginning or the end portion of the sector or sectors that have been read.

In an example, the desired compressed data found in two contiguous sectors within a block may be returned to the memory controller. Each sector had a CRC that had previously been inserted in the stored data to protect the data in transit from the memory device to the memory controller. After the integrity of each sector data is verified, the desired compressed data representing the user requested data is selected from the two sectors for further processing by the memory controller. Since the selected data from each of the memory circuits of the RAID group represented 4 KB of uncompressed data, the decompression of the data will lead to the original 4 KB of data (2050). This data expansion may be performed at a level of the system having a significantly higher bus and computing bandwidth than is found on the memory circuit itself.

At a finer level of granularity of data storage, the user data may be a 512 B sector that is striped over the RAID group such that each memory module stores 128 B. This data may be packed into a 1 KB storage area on each module. The 512 B may be read directly from the appropriate module. Alternatively if the specific module is performing an erase operation, the other memory modules are not doing so in an erase-hiding example, and the desired data may be immediately obtained by reading the data on the other memory modules of the RAID group and reconstructing the data that is desired.

Decompression may be performed at a level in the system were the bandwidth of the system has been engineered to accommodate the uncompressed data at a desired line rate to service the request without a bottleneck occurring.

Alternatively, the system may be configured such that the decompression stage is the bottleneck and the processes at lower levels of the system optimized to reduce the processing time, data bandwidth and latency at levels below the decompression stage. All systems have such practical limitations and a balance is sought during the design stage.

Figure 10:
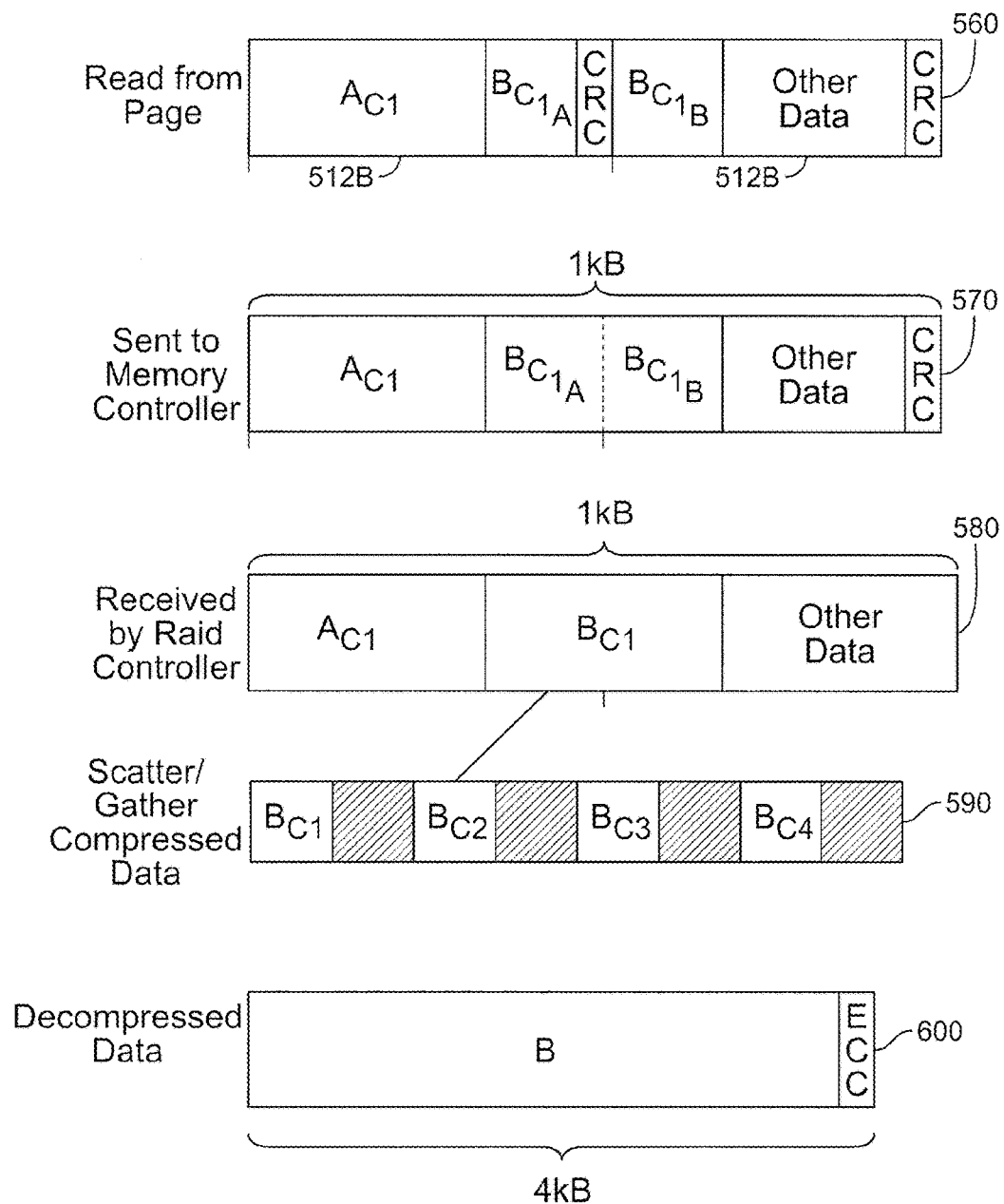
FIG. 10 shows a progression of data structures leading the decompression of the data.

The process 2000 may also be visualized from the aspect of the data in FIG. 10. In the example, two sectors are read (560) since the data "B" spans sector boundaries and the CRC of each sector may be used for data integrity checking. So, 1 KB of data has been sent to the memory controller (570), a portion of which is not needed. Depending on the capability of the RAID controller, the 1 KB data extent, including the unwanted data may be transmitted to the RAID controller (580). Alternatively a scatter-gather interface may be used at the RAID controller and the individual responses from the memory controllers 20 stored in the RAID controller 14. As shown here, each memory module response is stored in 1 KB of memory (590) including empty space so that the compressed page of user data may be decompressed into the same page. The situation shown is for a RAIDed system where erase hiding is not used, for simplicity of explanation, without intending this to be a limitation. The data may be decompressed in place and the ECC used to verify the data integrity (600).

A block diagram of a multi-chip FLASH memory circuit is shown in FIG. 3. Such a circuit is often sold in a package suitable for mounting to a printed circuit board. However, the circuit may be available as an unpackaged chip to be incorporated into another electronic package.

Each chip may have, for example, the following states that may be of interest:

Erase

Read (from memory cells to buffer)

Read data status (in buffer)

Read-data (from buffer to PHY)

Write (from buffer to memory cells)

Write status (in buffer or complete)

Receive write data (to buffer from PHY)

Chip enabled (or disabled)

The chip enable is used to select the chip of a plurality of chips sharing a common bus to which a command has been addressed. In this example, it may be presumed that the appropriate chip enable line has been asserted, and the appropriate command has been sent. After the response, if any is expected, to the command has been received by the controller, the chip enable may be de-asserted.

The individual chips of a memory package may perform operations or change state independently of each other. So, for example, if chip 1 has been enabled and sent a READ command, chip 1 will execute the command autonomously. While there may be provisions to interrupt an ERASE or WRITE command, the present discussion elects, for simplicity of presentation, to treat an erase and actual write or read operations between the buffer and the memory as non-interruptible. This is not intended to be a limitation on the subject matter disclosed herein.

Instead of assigning specific time durations to the execution of operations, one may consider that the salient operations of the chip may be described as parameterized by Tr (read full page from memory to buffer), Tt (data transfer of a full page over the shared bus), Tw (write full page from buffer to memory) and Te (erase block). Where a partial read command is performed (as will be described) the amount of time to transfer the read data from the buffer to the controller is kTt, where k has a value less than 1 and depends on the amount of data transferred. Status check operations are presumed to be completed in a time that is negligible compared with the above operations.

Effective operation of a group of FLASH memory chips relates the relative time costs of the main operations stated above and the characteristics of the operation (e.g., interruptible or non-interruptible), or whether partial page operations are permitted (e.g., reading a sector of a page)

For purposes of discussion, one may relate the times of the parameterized operations as approximately 1Te=3Tw=10 Tt=40 Tr. Recognizing that Te (erase block) only requires the transmission of a command and FLASH block identification on the bus and no data, the bus utilization for erase operations is small, but the time to complete such an operation is the largest of any of the individual operation types. That is not to say that erase operations may be performed without impact on the system, as a request for data made to any memory location page on a plane of a chip having any block thereof being erased would be delayed until completion of the Te. However, methods of masking the erase operation in a RAIDed memory system are known, as described in described in, for example, U.S. Pat. No. 8,200,887, issued Jun. 12, 2012, entitled "Memory Management System and Method", which is commonly owned and is incorporated herein by reference, and a high performance system may employ such techniques. The focus in the present example is on the minimization of the latency due to sharing a common data transfer bus, and the optimization of the rate of data transfer over the bus.

When data is written in full pages to a memory chip, the total time to complete the operation is Tt+Tw; however, the bus is occupied only for Tt (about ⅓ of the total time for a write operation to a chip for currently available products). Consequently, in this example, about 3 data pages may be transmitted over the bus during the average time to write a single page to a single chip, providing that the number of sequential writes is large (e.g., 10). For example, 10 pages may be written in 10Tt+Tw=13 Tt rather than 10 (Tt+Tw)+40 Tt. That is, about 3 times as many pages may be transmitted and written during the time that one of the other chips is performing an erase operation (recalling that Te=10 Tt and Tw=3Tt).

The chip that is the object of a READ command has the chip enable asserted and receives the READ command. The chip may perform the READ command, for example, while a READ command sent to another chip. FLASH chips may have a page buffer 25 for immediate access to the memory cells and a data cache 26 for interface with the data bus. In such a circumstance, data to be written to the memory cells may be transferred from the data cache to the page buffer; the data cache of the chip may receive another page of data while the previous page of data is being transmitted on the multiplexed bus.

The chips that previously received READ commands may be polled to determine if the data has been read from the memory cells into the page buffer or available in the chip data cache. This data may be transferred over the bus to the controller without the latency of the actual read operation, as the READ command has already executed. While Tr is small compared with Tw, an improvement in latency may nevertheless be obtained. That is, a plurality of chip read operations may be sequenced such that the read operations of each chip is performed while another chip is transmitting data that has been read from the chip to the memory controller.

Alternatively, the READ command may be issued and a poll performed after the expected read latency time has elapsed.

During READ Commands, the controller may issue a READ bus transaction to the indicated FLASH device. Reads may be followed by POLL commands to confirm that the previous command has completed. When READ Data is available in the FLASH device register or buffer, a READ Data Transfer command may be issued.

A typical bus capability internal to a FLASH package may be about 166 MT/s (where MT/s is millions of 8-bit data-transfers-per-second). The internal capability of an available FLASH chip to read data from the memory circuits to an output register may be of the order of 25 μsec to read a 4 KB page. So, in one second, about $160 \times 10^6$ bytes could be read and output of a single chip in the package would be sufficient to utilize the entire theoretical bus capacity of the memory module when reading. The package may comprise 8 or more chips, with two planes per chip. So a limitation on FLASH read performance is the internal bus capacity. Another way of expressing the read latency is that it takes 25 usec to read the first byte (really the transfer of the entire 4 KB page from the memory to the cache) and 0.3 μsec/byte to read the remaining bytes of the page. In an aspect, there are advanced read commands which can subsume the reading process for multiple pages of data stored within a block (e.g. 256 page increments) of the memory and such operations can be used within the context of the system and method disclosed here.

If less than the full contents of a page of FLASH memory is to be transferred to the controller 20 to represent the compressed page, the number of read operations per second can be increased as the amount of data transferred per operation has been reduced. As previously discussed, where data is being stored after being compressed and the native block size being compressed is, for example 4 KB, the stored data for the compressed page could be much less than 4 KB. In an example, we may use an estimate of 256 B or 512 B as a minimum useful size for the compressed data of a 4 KB page. Some minimum size is needed where data protection and data recovery are provided as the overhead space associated with data protection may place a minimum practical size on an extent of compressed data to be stored.

Data can be read out from the chip onto the bus in a byte-serial manner starting from the page buffer 26 with an arbitrary location within the memory page, and with an arbitrary length. The granularity of the start location may be a sector (e.g. 512 B) of the page, and the extent of the data to be read in a single operation is one or more multiple of 512 B. In such an arrangement, each integral 512 B sector of the page may include a CRC for that sector, which is inserted independently of the actual data format of the page. This protects each sector of data while in transit and may be stripped from the read data being transferred prior to, for example, decryption or decompression. Alternatively, the CRC may be computed for each compressed data segment and the start address and length be determined in integral bytes.

ECC complexity continues to increase as the reliability requirements on stored data are made more stringent, at least for enterprise applications, and the ECC may be performed at the memory controller, or in an ECC co-processor rather than within the FLASH memory chip.

The data received at a memory controller from the FLASH memory circuit may be comprised of an integral number of sectors of data that includes the compressed data that is being retrieved, one or more CRC elements, the ECC for the compressed data, and potentially some superfluous data for other data that is not being retrieved by the user. Each of the integral sectors may be first checked for transmission errors using the CRC and all of the received data may be stored in a memory area in the memory controller, which may be 4 KB size. The total amount of data stored in the memory area is initially less than 4 KB, as the data had been compressed. However, once the data has been verified, and corrected if needed by the ECC, the data may be decompressed, resulting in a 4 KB block of user data, which may be stored in place, or relocated.

The storage of data in a FLASH memory array may be further protected against loss by the use of a RAID architecture such as has been described, which may also enable at least one of erase or write hiding as an additional characteristic.

Alternatively, if the 4 KB data is first compressed at the RAID controller, a plurality of such compressed data extents may be packaged into a compressed 4 KB data extent and distributed by the RAID controller to the memory modules of the RAID group. Since each of the memory modules that are part of the RAID group are related by an algorithm, addressing the data in one of the memory modules of the RAID group results in generating the appropriate addresses for each of the memory modules. (There may be a further level of indirection at the memory module for purposes of garbage collection, wear leveling or the like, but such further address translation as may be required is presumed to be performed in a manner that is transparent to the RAID algorithm using, for example, a local indirection table.)

So, a request to read the original 4 KB data may be translated into a request to each memory module of the RAID group for the 1 KB segment of data that contains the requested compressed data identified by a LA and an extent, and the memory module may further translate this request into a read request to the memory device with the appropriate block number, offset and length to retrieve the data from the memory device. The extraneous data (other compressed data, uncompressed data or padding that is not being retrieved) may be stripped from the 1 KB of data and the desired compressed data returned to the RAID controller. The length of this data is variable, since the compression ratio varies. But, the uncompressed length is known and therefore the data may be positioned in the RAID controller memory so as to form a contiguous length of data when decompressed. The use of parity data to perform erase and write hiding is known through U.S. Pat. No. 8,200,877 and may be used with this scheme, but such use is not required.

Knowing the length of the data returned by each memory module, which is the same length for all of the memory modules of the RAID group, permits the use of a scatter/gather interface to assemble the received data.

Once a complete copy of the compressed data is assembled in the RAID controller, the data may be decompressed and forwarded to the server portion of the memory system to respond to the user. Alternatively, the server may perform the decompression.

In an aspect, each user data block, which might be considered to be comprised of 4 KB of data at the level of the system where the data is being committed to non-volatile storage may be compressed so as to form a data block that is a multiple of 256 bytes, for example. A plurality of such compressed data extents may be stored in a 4 KB block, a parity computed for the block and 1 KB sub-extents of the block, and the parity for the block, combined into a page of data to be written to the memory modules of the RAID group.

FIG. 10 shows such an arrangement where each of the memory modules has either some of the compressed data or the related parity data. When the READ request is issued, the address of the data and the size of the data, as stored in each of the memory modules may be computed and only this data and parity data requested from the memory modules of the RAID group. Where erase hiding is used, or any method or system that has a similar effect, one of the memory modules may be executing an erase operation and have a high latency. The specific one of these memory modules performing an erase operation may be known at any time, or sensed, so either no read request is made to the memory module or the delayed response from that memory module is ignored. If the module being erased has the parity data, then all of the data will be immediately available with minimal delay. If the module being erased has some of the user data, then the parity data is available with no delay, and the delayed user data is computed using an exclusive-OR operation. In either instance, all of the data is rapidly available.

The interface between the memory controller and the memory modules may be a direct memory access (DMA) circuit configured to perform a scatter-gather function where this results in the intake of data from a plurality of sources and the writing of each data segment to a specific memory area. The DMA may be configured to write the data from the memory modules to a 4 KB area such that the four data segments needed are placed in the RAID controller memory. The segments representing compressed data may be located in sequential order, leaving a gap where a module is known to be in an erase mode, and the parity data may be used to reconstruct the missing data. Where all of the data is compressed user data, the four data segments are contiguous. Where the parity data is used to compute the late data (the data not requested), the reconstructed data may be stored in place of the data from the module in the erase mode.

At this juncture, all of the user data, including the ECC data for the user data is within the 4 KB size of the uncompressed user data (including space for the metadata). If the ECC was computed on the compressed data, the data may now be checked for errors and the verified or corrected data decompressed into the 4 KB storage space. If the ECC was computed on the uncompressed data, the data is decompressed and the ECC processed.

The number of bits in the ECC for uncompressed data storage may be limited by the amount of memory area provided by the memory circuit manufacturer for "spare" data, which may include the ECC and metadata. For a 4 KB FLASH data page, this may be, for example, 128 bytes. For applications where highly reliable data storage is a design consideration, this has caused concerns as the lifetime of FLASH memory circuits is limited either in terms of the total number of erase operation or the time since the data was last written. The error rate of read data increases rapidly near the end-of-life of a FLASH memory circuit and a larger number of bits in the ECC, or a combination of several ECC techniques. But this is usually limited by the amount of spare space. Here, where compression often results in a substantial reduction in the space needed to store a page of user data, an increased storage area can be allocated to data protection. The additional error correction capability may be stored with the data itself or in an ancillary area. Such data may not be needed for routine reading of data and may be retrieved when, for example, the first level of data correction is unable to correct the errors, when the detected error rate is near a data loss threshold, or in accordance with another protocol. So, apart from the processing associated with the generation of such data, the storage and retrieval of the additional error protection data does not place a significant burden on the system resources.

The error rate of TLC FLASH, for example is greater than that of either MLC (two level) or SLC (one level) circuits, and the lifetime of TLC FLASH is also lower. So additional error correction capability may improve the utility of these circuits.

Data compression may be used whether the data is deduplicated or undeduplicated data. In the case of deduplicated data, the user data referenced by a plurality of user processes or individual authorized users is represented by a single copy of the data, and a deduplication look-up table translates each user address to the common address where the data is stored. Both deduplicated and undeduplicated data may be compressed and stored using the apparatus and method described herein. Where a cache of frequently accessed data, including deduplicated data, is maintained in a higher speed memory, the data may be stored in either compressed or uncompressed format, depending of system response time considerations.

In another aspect, the user data may be encrypted in least one of transit from the user to the storage system, or at rest (as stored). At rest encryption is becoming common as it provides protection against unauthorized access to the data in a non-volatile memory that may be removed from the memory system for any reason. Recognizing that encrypted data is essentially random, the compression efficiency of encrypted data is poor. Consequently compression of the data prior to encryption results in a greater savings in the required memory. The error correcting code may be computed either before or after encryption, depending on the specific system design.

Where the data is encrypted in transit, this data may be decrypted prior to storage operations and is separately encrypted for at rest purposes. Each user may have a separate encryption key for communication between the user system 1 and the storage system 10. A well-known encryption technique for use on the internet is the SSL (secure socket layer), however other techniques may be used.

When methods are described, and a listing of steps to be performed is given, it should be understood that the ordering of the steps is illustrative and steps in the method may be combined, omitted, reordered, repeated or the like without departing from the teachings of the disclosure. Similarly, in the claims, the use of letter or numerical identification of clauses is for clarity in description and does not imply a restriction on the sequence of performance of the steps in the method.

The preceding discussion focused on the storage of data that has been compressed. In a memory system 10, there may also be data stored that has not been compressed. This data may be of a type where compression is ineffective. A user may require that the data be stored in a previously encrypted form. Such data have poor compression efficiencies and may be identified and stored without compression. In such a circumstance the data may be stored where a 4 KB user data page maps to a 4 KB page at the RAID controller.

Alternatively, in a system where RAID is not used, the 4 KB page may be written to a 4 KB page of a FLASH memory circuit.

Although the present invention has been explained by way of the examples described above, it should be understood to the ordinary skilled person in the art that the invention is not limited to the examples, but rather that various changes or modifications thereof are possible without departing from the spirit of the invention.

What is claimed is:

1. A method of reading compressed data in a storage system, comprising:
   providing a processing system including a data compression engine;
   providing a memory system for storing data having a plurality of pages having a first length, each page having a plurality of sectors having a second length;
   identifying, using the processing system, a physical page of the memory system in which user-requested compressed data is stored as part of a concatenated compressed data page, including a sector in which user-requested data is stored, a length of the user-requested data and a starting address offset of the user-requested data;
   reading the sectors of the physical page that contain the user-requested data;
   receiving the data read from the sectors of the physical page and storing the received data in the processing system;
   computing a first error correcting code (ECC) for the data for each of the sectors read from the physical page;
   comparing the ECC computed for each sector with an ECC previously stored in each sector;
   storing the compressed data corresponding to user requested data when an ECC check is valid;
   decompressing stored compressed data; and
   responding to the user request for data.

2. The method of claim 1, further comprising:
   decompressing the compressed user data;
   computing a second ECC for the decompressed user data and validating the decompressed user data using the second error correcting code (ECC) previously stored for the compressed user data,
   wherein the second ECC was computed prior to compressing the user data and was stored with the compressed user data; and, the second ECC is capable of detecting and correcting errors.

3. The method of claim 2, where for the second ECC, the step of validating indicates a data error, reading a third ECC for page data and correcting a page data error using the third ECC, wherein the third ECC for the page data was previously stored with the page data.

4. The method of claim 1, when the concatenated compressed data page has been stored in a RAID group;
   reading a portion of the concatenated compressed data page stored in the RAID group;
   storing a portion of the concatenated compressed page data in a memory area equal in size to that originally occupied by a user data page; and
   decompressing the data in place.

5. A storage system, comprising:
   a processor having a communications interface and a buffer memory, in communication with a memory module, the processor configured to;
   receive user data having a data length over the communication interface; and
   compress the user data length to a compressed data length;
   the memory module comprising a plurality of pages, each page having a length; wherein, if:
   the length of a first compressed user data is less than the length of the page of the memory module,
   a second compressed user data length is concatenated with the first compressed user data length and further compressed user data lengths are concatenated, until a length of concatenated compressed user data is equal to or greater than the length of data page of the memory module; and the processor is further configured to:
   store data of the concatenated user data extending from a beginning of a first compressed data page to the length of the page of the memory module.

6. The storage system of claim 5, wherein an error correction code (ECC) is computed at fixed intervals in the data to be stored in the page of the memory module.

7. The storage system of claim 6, wherein the user compressed data length includes the length of the ECC.

8. The storage system of claim 7, wherein the ECC is a cyclic redundancy code.

9. A method of storing data in a storage system, comprising:

providing a processing system including a data compression engine;

providing a memory system having a plurality of physical memory pages for storing data, each physical memory page having a first length, partitioned into a plurality of sectors, each sector having a second length;

receiving a plurality of pages of user data over an interface from a user system;

determining whether a page of the plurality of pages of user data is to be stored as compressed data in the memory system, and:

for the page of user data to be stored as compressed data:

compressing the page using the data compression engine to form a compressed data having a third length wherein each third length includes an allocation of space for a first ECC for the data of the third length and each second length of the third length includes an allocation of space for a second ECC for the data of the second length;

compressing another page of the user data using the data compression engine to form another compressed page having another third length and concatenating the third length and the another third length of compressed data to form a fourth length of compressed data and continuing to perform the steps of compressing and concatenating compressed data of the third length and the fourth length for additional pages of compressed user data and determining the fourth length until the fourth length is equal to or greater than the first length;

computing second error correcting code (ECC) data for the data of each second length of the of concatenated compressed data to be stored and inserting the computed ECC in a corresponding second length; and storing the fourth length of compressed data extending from a beginning of the first second length of the fourth length to the first length of the physical memory page in the memory system.

10. The method of claim 9, further comprising storing the concatenated compressed data in a RAID group.

11. The method of claim 9, where the second ECC type is a cyclic redundancy code (CRC).

12. The method of claim 9, wherein the first ECC is computed for each page of compressed data and is a different ECC type from the second ECC type.

13. The method of claim 9, wherein a third error correcting code (ECC) is computed for data of the fourth length prior to storing the data in a page of the memory system and is a different ECC type from the second ECC type.

14. A computer program product, stored on a non-volatile computer readable medium, comprising instructions for configuring a processor to:

perform the steps of:

receiving user data;

determining whether the user data should be stored as compressed page data in a page of physical memory, the page being formed of sectors of a fixed length, and:

for data to be stored as compressed page data;

compressing the user data;

determining a length of the first compressed data page, including space for at least a first error correcting code (ECC); and, when the length of the first compressed data page is less than a page in length: compressing a second page of data to form a second compressed data page;

concatenating the first and the second compressed data pages as a data extent and continuing to perform the step of determining a length of the concatenated compressed data until the length of the data extent is equal to or greater than a length a page of physical memory system, including space for a second ECC for the data of each sector;

computing first ECC data for each compressed data page and including the first ECC data in the compressed data page;

computing second ECC data for the data of each sector and including the second ECC data in the sector;

storing the combined compressed data pages extending from a beginning of the first compressed data page to the length of the page in a physical memory, including overhead data.

15. The computer program product of claim 14, further comprising:

when the length of the concatenated compressed data exceeds the length of a page:

selecting the portion of the length of the concatenated compressed data exceeding the length of the page and using the selected length as the first compressed data page of the page of compressed data pages to be stored in another page in the physical memory.

* * * * *

UNITED STATES PATENT AND TRADEMARK OFFICE
CERTIFICATE OF CORRECTION

PATENT NO. : 9,838,045 B1
APPLICATION NO. : 15/059874
DATED : December 5, 2017
INVENTOR(S) : Jon C. R. Bennett It is certified that error appears in the above-identified patent and that said Letters Patent is hereby corrected as shown below:

In the Claims

In Column 18, Claim 1, Lines 10-11, after "data corresponding to" replace "user requested" with --user-requested--.

In Column 18, Claim 5, Line 53, after "than the length of" insert --a--.

In Column 20, Claim 14, Line 24, after "greater than a length" insert --of--.

Signed and Sealed this
Seventeenth Day of April, 2018

Andrei Iancu
*Director of the United States Patent and Trademark Office*